(12) United States Patent
Nishimura et al.

(10) Patent No.: US 6,392,641 B1
(45) Date of Patent: May 21, 2002

(54) PLL CIRCUIT FOR DIGITAL DISPLAY APPARATUS

(75) Inventors: Eizo Nishimura; Satoru Kondou; Masanori Kurita, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/248,279

(22) Filed: Feb. 11, 1999

Related U.S. Application Data

(63) Continuation of application No. PCT/JP96/03395, filed on Nov. 20, 1996.

(51) Int. Cl.[7] .................................................. G09G 5/00
(52) U.S. Cl. ......................... 345/213; 331/1 A; 331/20
(58) Field of Search .............................. 345/213, 98, 99; 375/376, 372; 327/156, 158; 348/542, 538; 331/1 A, 20

(56) References Cited

U.S. PATENT DOCUMENTS

| | | | |
|---|---|---|---|
| 4,812,783 A | | 3/1989 | Honjo et al. |
| 4,958,228 A | | 9/1990 | Kutski |
| 4,996,596 A | * | 2/1991 | Hirao et al. ................. 348/542 |
| 5,304,954 A | * | 4/1994 | Saito et al. .................. 331/1 A |
| 5,334,954 A | * | 8/1994 | Koblitz et al. ................. 331/20 |
| 5,335,018 A | * | 8/1994 | Mohlmann et al. .......... 348/536 |
| 5,557,648 A | * | 9/1996 | Ishihara ....................... 375/376 |
| 5,646,564 A | * | 7/1997 | Erickson et al. ............. 327/158 |
| 5,671,260 A | * | 9/1997 | Yamauchi et al. ........... 375/372 |
| 5,811,998 A | * | 9/1998 | Lundberg et al. ............ 327/156 |
| 5,926,174 A | * | 7/1999 | Shibamiya et al. .......... 345/213 |

FOREIGN PATENT DOCUMENTS

| | | |
|---|---|---|
| EP | 0 497 377 A2 | 8/1992 |
| EP | 0 544 245 A1 | 6/1993 |
| EP | 0 555 569 A1 | 8/1993 |
| JP | 55-115775 | 9/1980 |
| JP | 61-214868 | 9/1986 |
| JP | 2-109469 | 4/1990 |
| JP | 2-288787 | 11/1990 |
| JP | 5-292432 | 11/1993 |
| JP | 5-300470 | 11/1993 |
| JP | 07-170422 | 7/1995 |
| WO | WO98/07272 | 2/1998 |

OTHER PUBLICATIONS

JPO International Search Report, PCT/JP96/03395, Dec. 13, 1996.

* cited by examiner

*Primary Examiner*—Chanh Nguyen
*Assistant Examiner*—Fritz Alphonse
(74) *Attorney, Agent, or Firm*—Staas & Halsey LLP

(57) ABSTRACT

A PLL circuit is provided with a lock/unlock detection circuit which detects the locked or unlocked state of the PLL circuit by comparing the phases of a horizontal synchronizing signal with each other and an internal synchronizing signal generating circuit which outputs the comparison signal as an internal synchronizing signal when the locked state is detected or outputs the horizontal synchronizing signal as an internal synchronizing signal when the unlocked state is detected. Another mode of a PLL circuit is provided with a skew detecting circuit which resets a frequency dividing circuit upon detecting a skew which is deviated from a normal period in an external synchronizing signal, generates a dummy pulse upon detecting that no skew occurs in the external synchronizing signal in the normal period, and generates a reference signal in combination of the dummy pulse with the external synchronizing signal. When the skew detection circuit detects a skew, the circuit also resets a phase comparator circuit. A digital display apparatus having such a PLL circuit prevents disturbance of the image when the PLL circuit is in an unlocked state or a skew occurs.

17 Claims, 13 Drawing Sheets

PLL CIRCUIT FOR DIGITAL DISPLAY APPARATUS

This application is a continuation of PCT/JP96/03395 filed Nov. 20, 1996.

TECHNICAL FIELD

The present invention relates to a PLL (Phase Locked Loop) circuit for a digital display apparatus, and, more particularly, to a PLL circuit which can avoid, as much as possible, disturbance of an image at the time the PLL circuit is unlocked and locked in.

BACKGROUND ART

For digital display apparatuses, such as a PDP (Plasma Display Panel) apparatus and an LCD (Liquid Crystal Display) apparatus, which internally carry out digital processing in accordance with a horizontal sync signal and a vertical sync signal, both supplied in an analog form, and an image signal having a predetermined timing based on those sync signals, an internal system clock signal which is synchronous with the horizontal sync signal or the like is generated by using a PLL circuit.

An input analog image signal is sampled and converted to a digital signal by using a system clock signal whose frequency is K times the frequency of the horizontal sync signal generated by a PLL circuit and an internal sync signal or a comparison signal, which is the system clock signal frequency-divided by K, and an image is displayed via individual drive circuits of the display panel. This can allow the internal sync signal and system clock signal, phase synchronous with the horizontal sync signal, to be completely synchronized to each other at the time of locking, so that an image signal can be accurately sampled and displayed.

Briefly speaking, an ordinary PLL circuit, which will be discussed in detail later, compares an input external horizontal sync signal with a variable horizontal sync signal as a comparison signal by means of a phase comparator, generates from the obtained phase difference a voltage corresponding to the phase difference by means of an integrator (low-pass filter), and controls a voltage controlled oscillator (VCO) with this voltage to thereby generate a system clock signal synchronous with the external horizontal sync signal. This system clock signal is frequency-divided by an integer number and the resultant signal is fed back to the phase comparator as the variable horizontal sync signal of the comparison signal. This feedback loop controls the VCO in accordance with the phase difference, so that a system clock signal synchronous with the external horizontal sync signal can always be generated stably.

However, when a TV channel is switched or switching between a video mode and a TV mode is performed, or when the mode is switched to a multi-scan mode on the monitor side, for example, the phase of the input horizontal sync signal or vertical sync signal is changed, and a phase difference is produced between the external horizontal sync signal and comparison signal immediately after switching, setting the PLL circuit in an unlocked state. Of course, the voltage controlled oscillator (VCO) in the PLL circuit changes and controls the frequency of the system clock according to the phase difference to carry out lock-in, but until such lock-in is implemented, the lock-off state continues, causing a phenomenon like rolling of images on the display screen.

As a solution to this shortcoming, some approaches have been proposed, such as outputting no image on the screen when lock-off occurs. However, blackening the screen, even temporarily, is not a preferable solution.

An external horizontal sync signal in a composite image signal which is output from a home VTR or the like includes a skew deviated from the normal period according to, for example, the VHS standards. Further, an extra pulse or the like may be added to the external horizontal sync signal for some other reasons. When such a skew pulse or added pulse occurs, a large phase difference with respect to the comparison signal is detected. When a pulse is added in a midway, for example, a deviation of 180 degrees is detected. Further, the skew itself causes a significant phase difference.

When such a large phase difference is detected, the control voltage according to that phase difference becomes greater than the control range exceeding the lock range, and goes off the control range of the VCO, so that the unlocked state continues for a long time. During that period, the system clock that should be output becomes asynchronous with the external horizontal sync signal, disturbing images. Although a PLL circuit is originally so designed as to follow up a slight variation in the external horizontal sync signal, the aforementioned occurrence of a large phase variation is not anticipated. With respect to the occurrence of a skew pulse or an added pulse, therefore, it takes a long time to implement lock-in from the unlocked state.

DISCLOSURE OF INVENTION

It is therefore an object of the present invention to provide a PLL circuit which can output an optimal internal sync signal even when lock-off of a PLL circuit in a digital display apparatus occurs.

It is another object of this invention to provide a digital display apparatus which can prevent an undesirable phenomenon like rolling of images even in an unlocked state.

It is a further object of this invention to provide a PLL circuit which does not have an unstable operation even when a skew pulse or an extra pulse occurs.

According to this invention, the above objects are achieved by a phase locked loop circuit for a digital display apparatus for outputting a clock signal whose frequency is a multiple of a frequency of a horizontal sync signal to be supplied by an integer number, and feeding back a comparison signal whose frequency is the clock signal frequency-divided by the integer number to thereby generate the clock signal phase-synchronous with the horizontal sync signal, which circuit comprises:

a lock/unlock detection circuit for comparing phases of the horizontal sync signal and the comparison signal to detect a locked state and an unlocked state of the phase locked loop circuit; and an internal sync signal generation circuit for outputting the comparison signal inside as an internal sync signal when the locked state is detected by the lock/unlock detection circuit and outputting the horizontal sync signal as the internal sync signal when the unlocked state is detected.

With this structure, as an internal sync signal which becomes a reference internal horizontal sync signal, the comparison signal is used in a locked state and the horizontal sync signal that is externally supplied is used in an unlocked state. Since the external horizontal sync signal which keeps a phase relationship with an image signal even in an unlocked state including a lock-in state is directly used as the internal horizontal sync signal, therefore, it is possible to prevent a phenomenon like rolling of images on the screen.

According to this invention, the above objects are achieved by a digital display apparatus for receiving from outside a external horizontal sync signal, a external vertical sync signal and an analog image signal having a predetermined timing based on the external sync signals, generating a digital image signal inside and displaying an image, which apparatus comprises:

a phase locked loop circuit for outputting a clock signal whose frequency is a multiple of a frequency of the horizontal sync signal by an integer number, and feeding back a comparison signal whose frequency is the clock signal frequency-divided by the integer number to thereby generate the clock signal phase-synchronous with the horizontal sync signal;

a generation circuit for generating an internal horizontal sync signal based on the comparison signal when the phase locked loop circuit is in a locked state, and generating the internal horizontal sync signal based on the external horizontal sync signal when the phase locked loop circuit is in an unlocked state;

an analog-to-digital converter for sampling the analog image signal in accordance with the clock signal, thereby generating the digital image signal; and a display unit for displaying the image in accordance with the digital image signal and the internal horizontal sync signal.

According to this invention, the above objects are achieved by a PLL (Phase Locked Loop) circuit for a display apparatus for generating a clock signal synchronous with an external sync signal in an image signal to be supplied, which comprises:

a phase comparator for comparing phases of a reference signal including the external sync signal and a comparison signal and generating an output according to the phase difference therebetween;

an oscillator for controlling a frequency of the clock signal of output in accordance with the phase difference;

a frequency divider for frequency-dividing the clock signal by an integer number to thereby generate the comparison signal;

a skew detector for detecting occurrence of a skew, in which the phase in the external sync signal is deviated from a normal period, to reset the frequency divider.

The skew detector generates a dummy pulse upon detection of the sync signal being not generated even when the normal period has elapsed, and further synthesizes the external sync signal and the dummy pulse, thereby generating the reference signal.

The skew detector resets the phase comparator upon detection of occurrence of the skew.

With this structure, even when a skew occurs in an external sync signal, the counter of the frequency divider in the PLL circuit is reset, causing the comparison signal to be likewise generated in association with the skew, so that the occurrence of the skew does not produce a large phase difference between the external sync signal and the comparison signal. The PLL circuit can therefore maintain the lock-in state.

Even when the external sync signal is shifted toward a longer period, a dummy pulse is generated and is synthesized with the external sync signal, so that an unlocked state originated from pulse drop-out can be avoided. Further, because the phase comparator is reset immediately upon occurrence of a skew, the PLL circuit does not go unlocked even when a dummy pulse overlaps the skewed external sync signal.

It is desirable that the above PLL circuit is used for a digital display apparatus, such as a PDP or LCD.

BEST MODES FOR CARRYING OUT THE INVENTION

Preferred embodiments of the present invention will now be described with reference to the accompanying drawings. It is however to be noted that the technical scope of this invention is not restricted by the embodiments.

Figure 1:
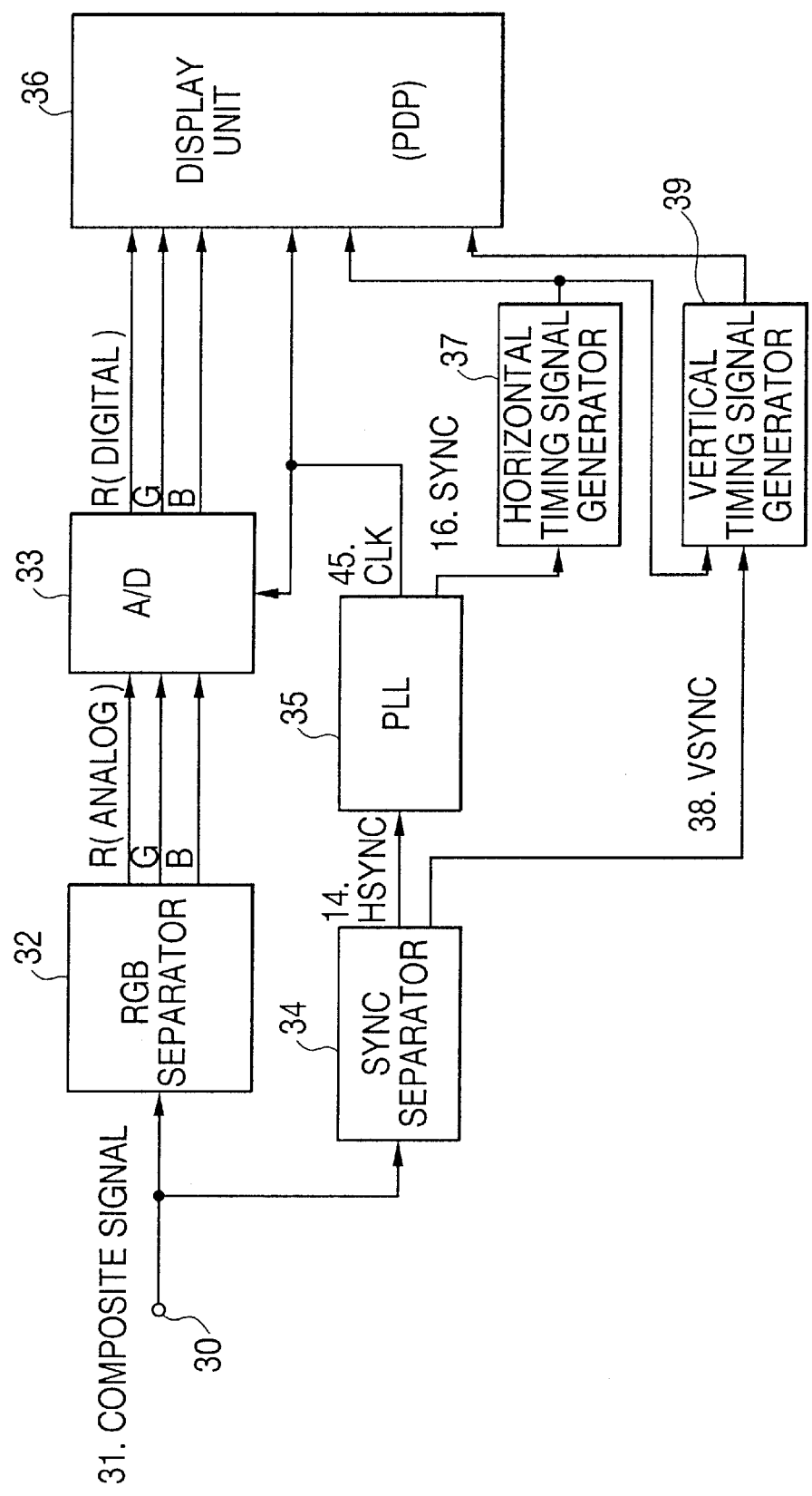
FIG. 1 is a block diagram presenting a schematic overall view of a digital display apparatus.

FIG. 1 is a block diagram presenting a schematic overall view of a digital display apparatus. Input to an input terminal 30 is a composite signal 31 from an external image reproducing apparatus, for example, a video tape recorder (VTR). This composite signal 31 is input to an RGB separator 32 to be separated into R, G and B analog signals. At the same time, the composite signal 31 is separated into a horizontal sync signal (Hsync) 14 and a vertical sync signal Vsync 38 by a sync separator 34.

A system clock signal (CLK) 45 whose frequency is an integer multiple of that of the horizontal sync signal 14, input from an external image reproducing apparatus, is generated in a PLL circuit 35 in synchronism with the horizontal sync signal 14. The system clock signal 45 generated in the PLL circuit 35 is supplied to an A/D converter 33, which performs sampling and A/D (Analog-to-Digital) conversion, and a display unit 36. The detailed description of this PLL circuit 35 will be given later with reference to FIG. 2.

The A/D converter 33 samples the analog RGB signals at the timing of the system clock signal 45, and converts the sampled analog signals to digital signals of predetermined bits. The RGB digital signals extracted at that timing are supplied to the display unit 36 and are displayed on the display unit 36 in accordance with the electrode driving scheme of a PDP apparatus by using an internal horizontal sync signal (output of 37) and an internal vertical sync signal (output of 39), both generated internally, and the aforementioned system clock signal 45. When synchronism with the external sync signal is gone, therefore, disturbance such as rolling of images on the screen occurs. Similar driving and display are implemented too when a liquid crystal display panel is used.

In the digital display apparatus, a horizontal timing signal generator 37 generates a horizontal timing signal necessary in the display unit 36 by using, as an internal sync signal (SYNC) 16, a comparison signal obtained by frequency-dividing the system clock signal 45, generated in the PLL circuit in the above-described manner, by an integer number. A vertical timing signal generator 39 generates a vertical timing signal from the vertical sync signal 38, separated from the composite signal 31, and the horizontal timing signal. The horizontal and vertical timing signals are supplied to the display unit 36.

According to a first embodiment of this invention, as the internal sync signal (SYNC) 16, the comparison signal is used when the PLL circuit is in a locked state, and the external horizontal sync signal (EHD) 14 externally supplied is used in an unlocked state, as mentioned above. Detection of lock-off is carried out by monitoring a phase difference between the external horizontal sync signal 14 and the comparison signal.

Figure 2:
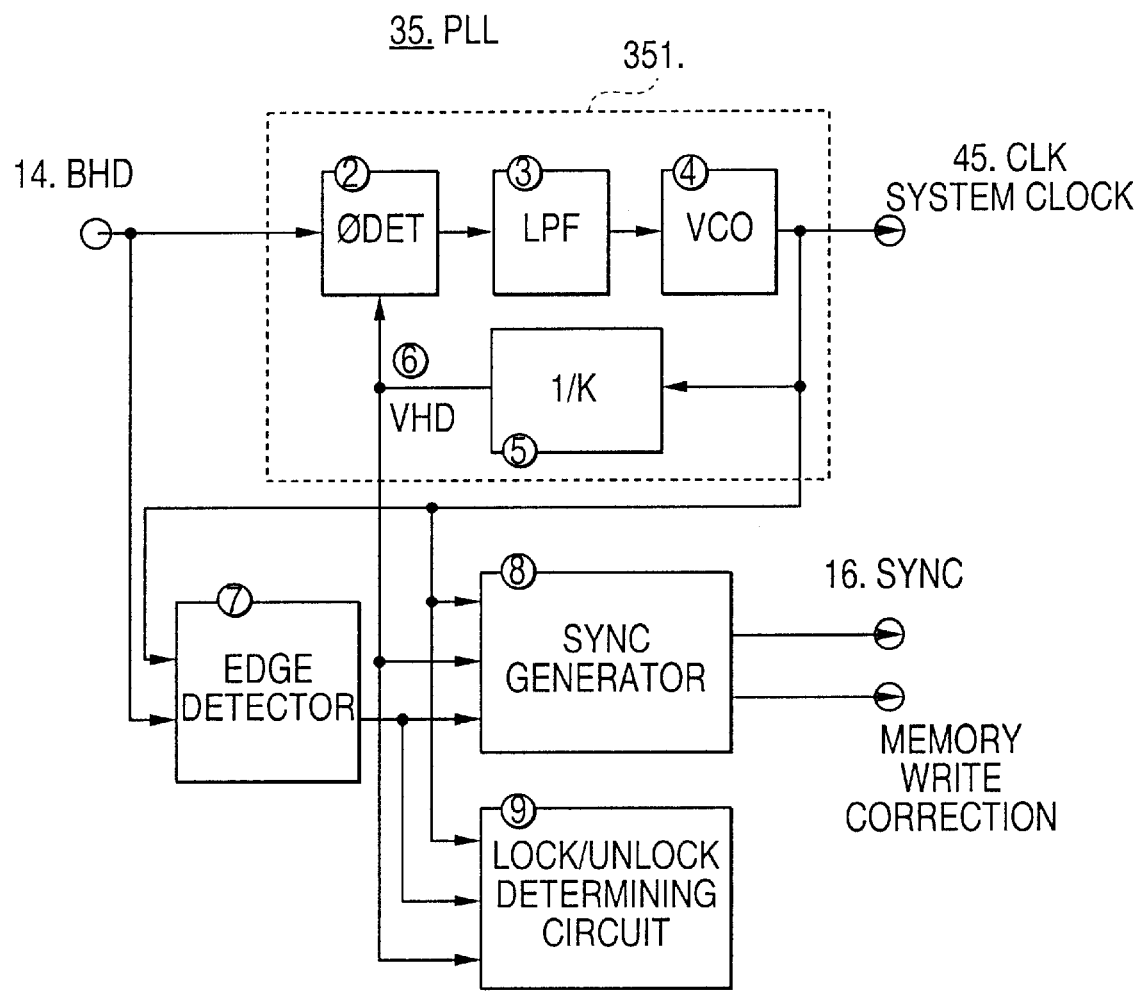
FIG. 2 is a block diagram of the internal structure of a PLL circuit 35 in FIG. 1.
Figure 3:
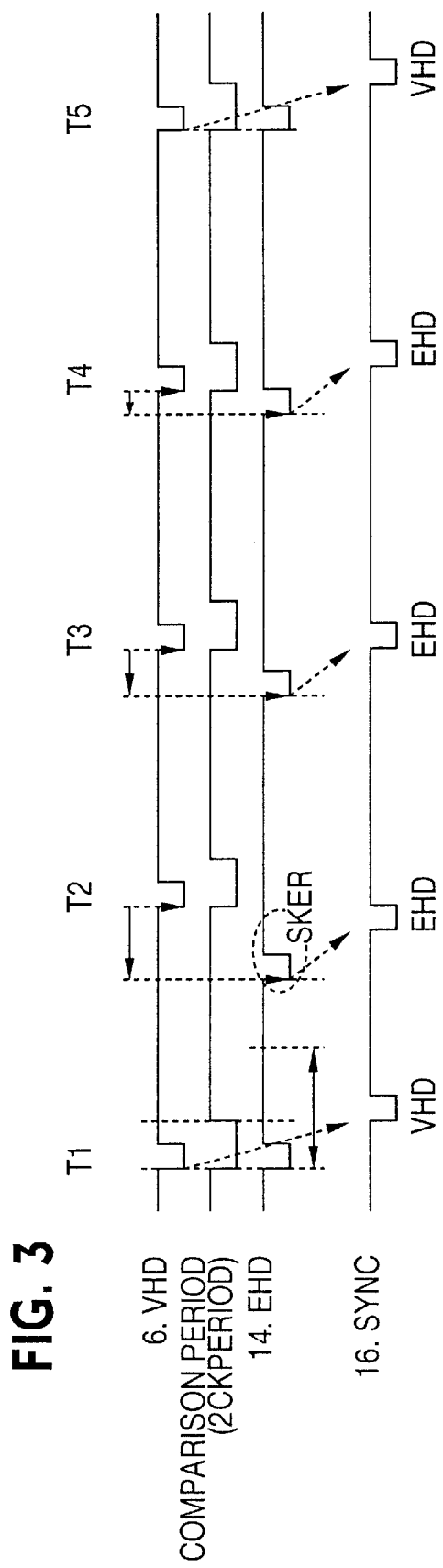
FIG. 3 is a timing chart for explaining how the PLL circuit 35 switches an internal sync signal SYNC 16.

FIG. 2 is a block diagram of the internal structure of the PLL circuit 35 in FIG. 1. FIG. 3 is a timing chart for explaining how the PLL circuit 35 switches the internal sync signal (SYNC) 16.

Input to the PLL circuit 35 in FIG. 2 is the horizontal sync signal (EHD) 14, which is separated from the composite image signal by the sync separator 34 as mentioned above. As outputs, the system clock signal (CLK) 45 and the internal sync signal (SYNC) 16 are output. "2" denotes a phase comparator which compares the phase of the horizontal sync signal EHD 14, input externally, with the phase of a comparison signal (VHD) 6, which is the system clock signal (CLK) 45 frequency-divided by K (K: integer), and outputs a signal according to the phase difference. "3" denotes an integrator or a low-pass filter, which supplies the integral value of the output of the phase comparator 2 to a voltage controlled oscillator 4 as a control voltage. The voltage controlled oscillator (VCO) 4 generates a clock signal of a frequency according to the phase difference, and outputs it as the system clock signal (CLK) 45. Therefore, a portion 351 surrounded by the broken line is the conventional ordinary PLL circuit portion. Conventionally, the comparison signal (VHD) 16, obtained by frequency-dividing the system clock signal CLK, was used directly as the internal sync signal (SYNC) 16.

The PLL circuit in FIG. 2 further comprises a circuit (edge detector) 7, which detects the falling edge of the external horizontal sync signal EHD 14 and outputs a pulse signal 14A having one pulse width of the system clock signal CLK 45, a circuit 9 for determining if the PLL circuit is in a locked state or an unlocked state, and an internal sync generator 8, which selects and outputs either the comparison signal VHD 6 or the external horizontal sync signal EHD 14 in accordance with the output of the determining circuit 9.

The operation will be described schematically with reference to FIG. 3. In the PLL operation in the normal locked state, the lock/unlock determining circuit 9 determines if the external horizontal sync signal EHD 14 becomes an L level during a comparison period of two pulses generated from the comparison signal VHD 6, for example. Because of the inherent feedback operation of the PLL circuit, the phase of the output system clock signal is accompanied with a kind of fluctuation called a jitter. It is thus necessary to allow for this jitter in determining if the phases of the external horizontal sync signal EHD 14 and the comparison signal VHD 6 are synchronous with each other, and as mentioned above, a period of two pulses based on the comparison signal (VHD) 6 is treated as the comparison period.

Figure 4:
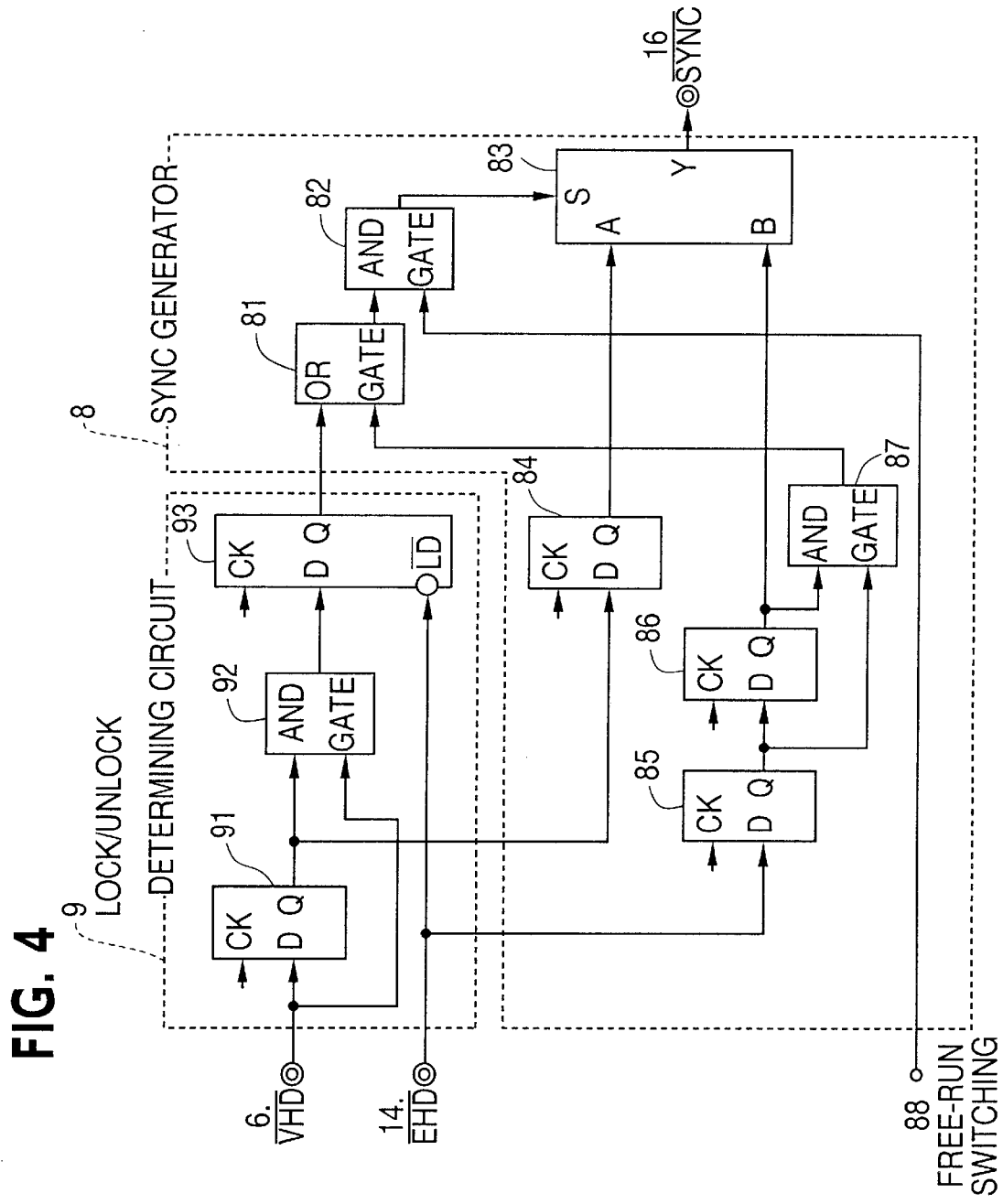
FIG. 4 is a detailed block diagram of a lock/unlock determining circuit and an internal sync signal generator in the PLL circuit.
Figure 5:
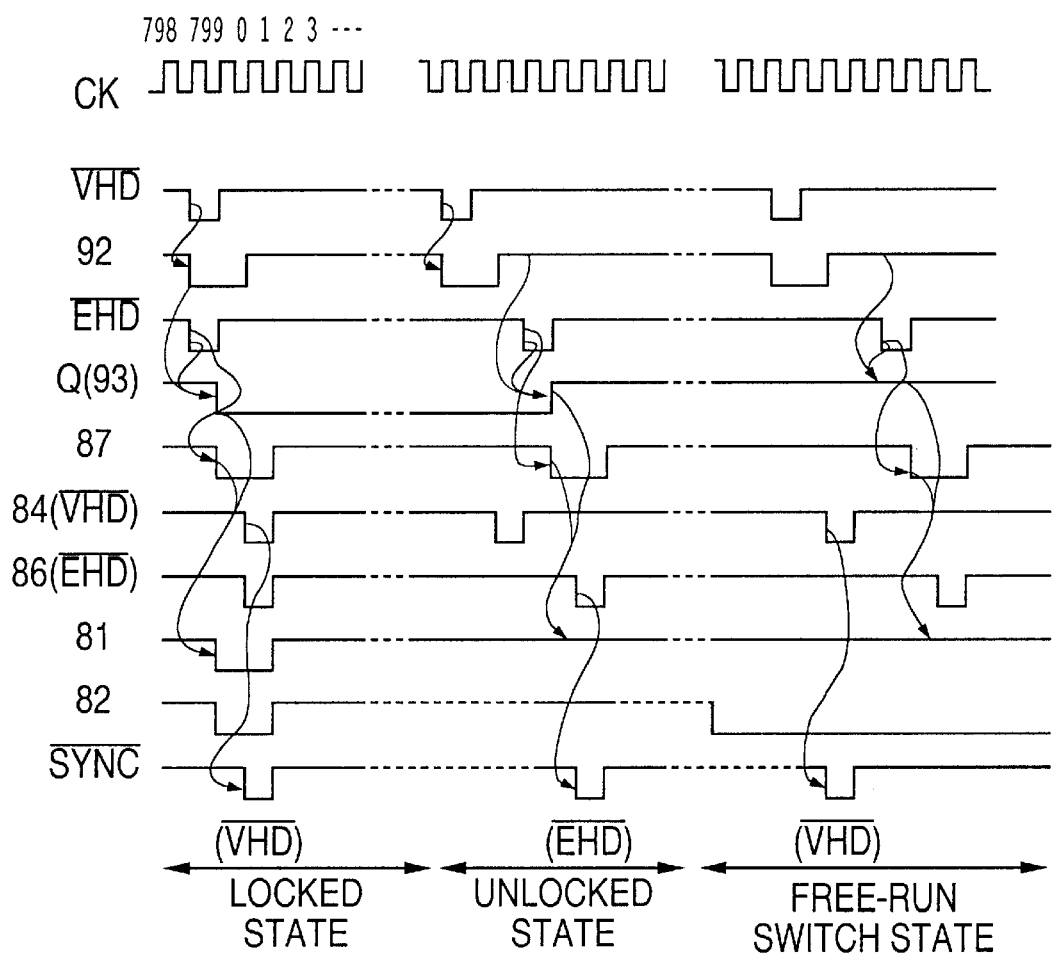
FIG. 5 is a timing chart for the circuits in FIG. 4.

As shown in FIG. 3, at T1, the external horizontal sync signal EHD 14 and the comparison signal VHD 6 are in phase, providing a locked state. In this case, therefore, the comparison signal (VHD) 6 in the PLL circuit is selected and output as the internal sync signal (SYNC) 16 as usual. Next, at T2, the phase of the external horizontal sync signal (EHD) 14 is leading to the phase of the comparison signal (VHD) 6, resulting in a lock-off state. In this case, the external horizontal sync signal (EHD) 14 is selected and output as the internal sync signal (SYNC) 16. At T3 and T4 during a lock-in operation, as shown in FIG. 3, the external horizontal sync signal (EHD) 14 is kept selected and output. At T5, a locked state is provided for the first time, and the comparison signal (VHD) 6 is selected and output. FIG. 4 is an internal block diagram of the lock/unlock determining circuit 9 and the internal sync signal generator 8 in the PLL circuit 35 in FIG. 2. FIG. 5 is a timing chart for the circuits in FIG. 4, and shows signal waveforms in three states, namely, the locked state, unlocked state and free-run switching time.

As the comparison signal VHD 6 and the external horizontal sync signal EHD 14E are L-active signals in the sense of circuitry, bars (/VHD, /EHD) which mean inversion are shown in FIG. 4. Further, the external horizontal sync signal 14E is a pulse signal with a one-clock width which is generated upon detection of the falling edge of the externally supplied signal 14. "91," "84," "85" and "86" are delay flip-flops. First, in the lock/unlock determining circuit 9, a signal having a 2-pulse width is generated from the comparison signal (/VHD) 6 on the output of an AND gate 92, and the output (92) is loaded into a flip-flop 93 at the falling timing of the external horizontal sync signal (/EHD) 14E. Consequently, an L level is output on the output Q of the flip-flop 93 in a locked state where both signals are synchronous with each other, and an H level is output in an unlocked state where both signals are asynchronous with each other. A determination result signal on the output Q is supplied as an S signal of a switch circuit 83 via an OR and AND gates 81 and 82. A signal A delayed by two pulses of the comparison signal (/VHD) 6 is selected and output as the internal sync signal (SYNC) 16 in a locked state, and a signal B delayed by two pulses of the external horizontal sync signal (/EHD) 14E is selected and output as the internal sync signal (SYNC) 16 in an unlocked state.

"88" is a free-run switching signal which is given by an operator or the like who is manipulating the display apparatus and forcibly selects and outputs the comparison signal (/VHD) 6. The delay flip-flop 86, an AND gate 87 and the OR gate 81 are provided to give the output Q of the lock/unlock determining circuit 9 as the S signal to the switch circuit 83 only at the necessary timing because the load flip-flop 93 switches its output Q by the load signal of the external horizontal sync signal (/EHD) 14.

Referring to FIG. 5, the operations of the circuit in FIG. 4 in the respective states will be described. To begin with, the locked state will be discussed. A signal indicative of the comparison period of two pulses based on the comparison signal (/VHD) 6 is output to the AND gate 92. When the horizontal sync signal (/EHD) 14 phase-synchronous with the comparison signal (/VHD) 6 has an L level, the signal is loaded at the rising of the next clock signal so that an L level indicative of a locked state is output on the output Q of the flip-flop 93. The signal on the output Q (93) is supplied to the switch circuit 83 via the OR gate 81 in response to the L level of the clock signal (the output of 87) which has been generated from the external horizontal sync signal (/EHD) 14E by means of the flip-flops 85 and 86 and the AND gate 87. The free-run switching signal 88 is normally at an H level, so that the output of the OR gate 81 is passed through to the switch circuit 83. As a result, the switch circuit 83 selects the comparison signal (/VHD) 6 on the A terminal side and outputs it as the internal sync signal (SYNC) 16.

Next, an unlocked state will be described. The output of the AND gate 92 is the same as one described above. With the horizontal sync signal (/EHD) 14 having an L level, when the signal is loaded at the rising of the next clock signal, it is not phase-synchronous so that an H level is supplied to the input D and the signal is loaded into the flip-flop 93 and an H level is output on the output Q (93). An L level passes through the OR gate 81 at the timing of the output signal of 87 and an H level is supplied to the S signal of the switch circuit 83. Consequently, the B terminal side is selected and a signal (the output of 86) delayed from the external horizontal sync signal (/EHD) 14E by two pulses is output as the reference sync signal (SYNC) 16.

Unless the external horizontal sync signal 14E provides an L-level clock signal, the output of the OR gate 81 is fixed to an H level and the S signal of the switch circuit 83 becomes an H level, so that the comparison signal 6 will not be output.

When an unlocked state is determined, the comparison signal (VHD) 6 which is not in phase with an image signal is not used as the internal sync signal (SYNC) 16 but the horizontal sync signal (EHD) 14 externally supplied is used directly as the internal sync signal 16. With respect to the timing of the horizontal scan on the display screen, therefore, phase synchronism is pretty much established, making it possible to prevent disturbance like image rolling on the display screen. The system clock signal (CLK) 45 for sampling, though not in phase at the unlock time, has a slight deviation in frequency, so that no significant image disturbance does not occur. It is therefore possible to avoid a situation where significant rolling of images occurs in the unlocked state.

Further, in the free-run switching state, the switching signal 88 is forced to have an L level, so that the output of the AND gate 82 is also forced to become an L level. Thus, the comparison signal VHD 6 is selected as the internal sync signal (SYNC) 16 regardless of the locked or unlocked state.

Although the output of the AND gate 92 is used as a signal indicating the comparison period, this comparison period can be set, as needed, in accordance with the allowance for a jitter or allowance for forward and backward jitters.

According to the first embodiment, as described above, in a digital display apparatus, the PLL circuit which generates a system clock signal phase-synchronous with the horizontal sync signal externally supplied, and the internal sync signal (internal horizontal sync signal) for the internal usage can output the optimal sync signal as the internal sync signal in a locked state and an unlocked state. Even when an unlocked state is set temporarily as the channel is switched or the display mode is switched, therefore, a poor display condition, such as image rolling on the display screen can be prevented as much as possible Further, detection of a locked state and an unlocked state is implemented based on the existence or absence of a phase difference between the external horizontal sync signal 14 and the comparison signal 6.

A second embodiment of this invention will now be described. In the second embodiment of this invention, even when the external horizontal sync signal (Hsync) 14 includes a skew pulse or an extra pulse or has a pulse drop-out or the like, the lock-in state of the PLL circuit 35 can be maintained as much as possible, preventing the circuit from going into an unstable unlocked state for a long period of time. As a result, the PLL circuit 35 can generate a stable system clock signal.

Figure 6:
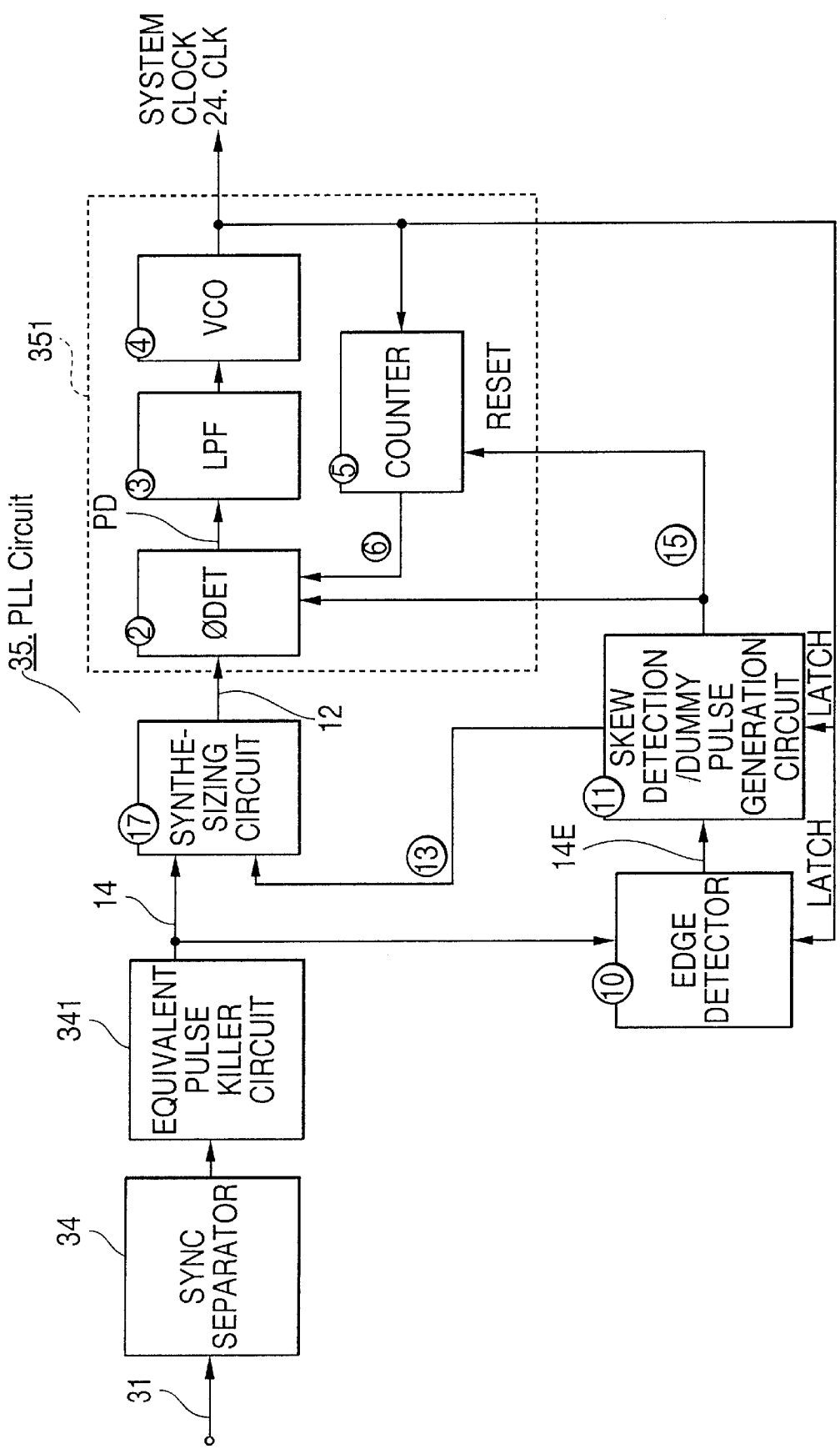
FIG. 6 is a block diagram exemplifying a PLL circuit according to one embodiment of this invention.

FIG. 6 is a block diagram exemplifying a PLL circuit according to the second embodiment of this invention. FIG. 6 shows the PLL circuit 35 in FIG. 1 excluding the sync separator 34 in FIG. 1 and an equivalent pulse killer circuit 341 which accompanies the separator. The equivalent pulse killer circuit 341 removes an equivalent pulse to bisect a horizontal sync signal, which is constituted by a double frequency in order to cope with the interlace type CRT in a case of the normal NTSC composite image signal.

A portion 351 surrounded by the broken line in FIG. 6 is the conventional ordinary PLL circuit portion. As mentioned earlier, the PLL circuit portion comprises a phase comparator 2 which detects a phase difference between a synthesized horizontal sync signal 12 and variable horizontal sync signal 6 as a comparison signal, an integrator (low-pass filter) 3 which converts the phase difference into a voltage value, a VCO 4 which outputs a system clock signal 45 using the voltage value as a control voltage, and a frequency divider (counter) 5 which frequency-divides the system clock signal 45 by K. The system clock signal 45, whose frequency is N times the frequency of the synthesized horizontal sync signal 12 and which is always synchronous with the horizontal sync signal 12, can be generated by controlling the frequency of the output of the VCO 4 in switch circuit the phase difference detected by the phase comparator 2.

According to this invention, the PLL circuit in FIG. 6 comprises an edge detector 10, which detects the falling edge of the external horizontal sync signal 14 and generates a pulse signal having a width of one system clock, a skew detection/dummy pulse generation circuit 11, which outputs a skew detection pulse 15 upon detection of occurrence of a skew pulse in the external horizontal sync signal 14 and outputs a dummy horizontal sync signal pulse 13 when the external horizontal sync signal 14 is not generated at an expected timing, and a synthesizing circuit 17, which synthesizes the dummy horizontal sync signal pulse 13 and the external horizontal sync signal 14. When a skew occurs, the counter 5 and the phase comparator 2 are reset by the skew detection pulse 15, temporarily stopping and resetting the PLL operation.

The basic operation of the PLL circuit 35 in FIG. 6 will be discussed with reference to FIGS. 7 and 8.

Figure 7:
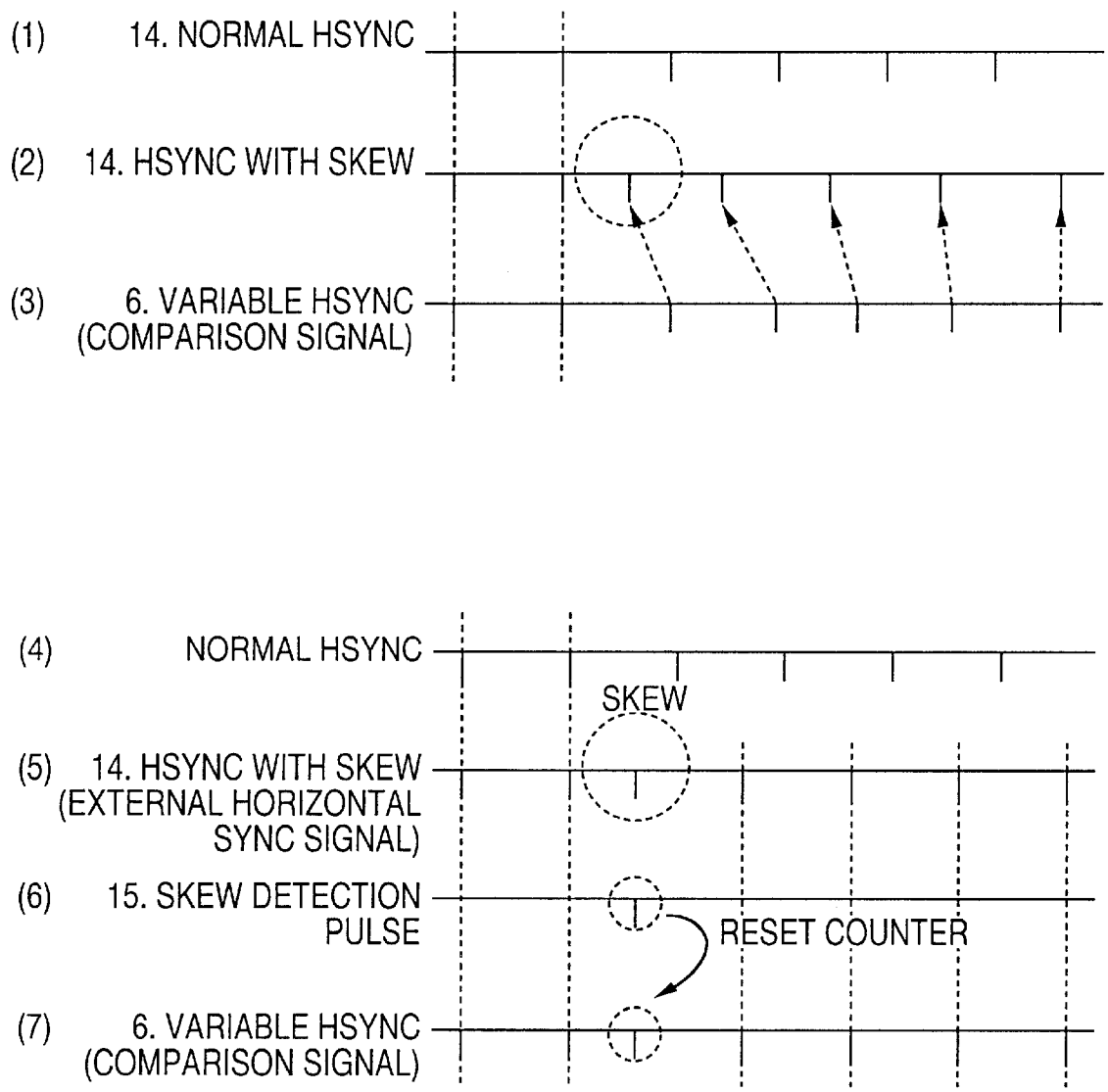
FIG. 7 is a timing chart illustrating a case where a skew occurs in a shorter period than an expected period of an external horizontal sync signal 14.

FIG. 7 presents a timing chart illustrating a case where a skew occurs in a shorter period than the expected period of the external horizontal sync signal 14. (1), (2) and (3) illustrate the operation of the conventional ordinary PLL circuit, and (4) to (7) illustrate the operation of the PLL circuit in FIG. 6. As indicated by (1), the normal horizontal sync signal Hsync is a pulse signal which is repeated in a nearly constant period. When a skew (deviation) occurs in a short period as indicated by (2), however, a large phase difference is produced between the horizontal sync signal and the variable horizontal sync signal (comparison signal) 6 which is fed back. This causes lock-off, and the VCO 4 performs control in accordance with the phase difference in such a way as to increase the frequency of the system clock signal. Lock-in is implemented in this manner, but when a phase difference becomes significantly large, it exceeds the control range of the VCO, so that lock-in will take a long time. During that period, images are disturbed.

Therefore, the PLL circuit 35 shown in FIG. 6 detects a skew pulse when it is generated, and outputs the skew detection pulse 15. That is, it is as shown in (5) and (6) in FIG. 7. Since the counter 5 is reset by the skew detection pulse 15, the variable horizontal sync signal 7 synchronous with the skew detection pulse 15 will be generated thereafter. Normally, the external horizontal sync signal 14 often generates pulses of a constant period after a skew occurs as indicated by (5) in the diagram. By resetting the PLL circuit when a skew occurs, therefore, from the next pulse, the PLL circuit can return to the locked state where the system clock signal synchronous with the external horizontal sync signal 14 is generated as has been before. As a result, the PLL circuit can keep a stable lock-in state, making it possible to prevent the period of the unstable unlocked state from becoming long.

Figure 8:
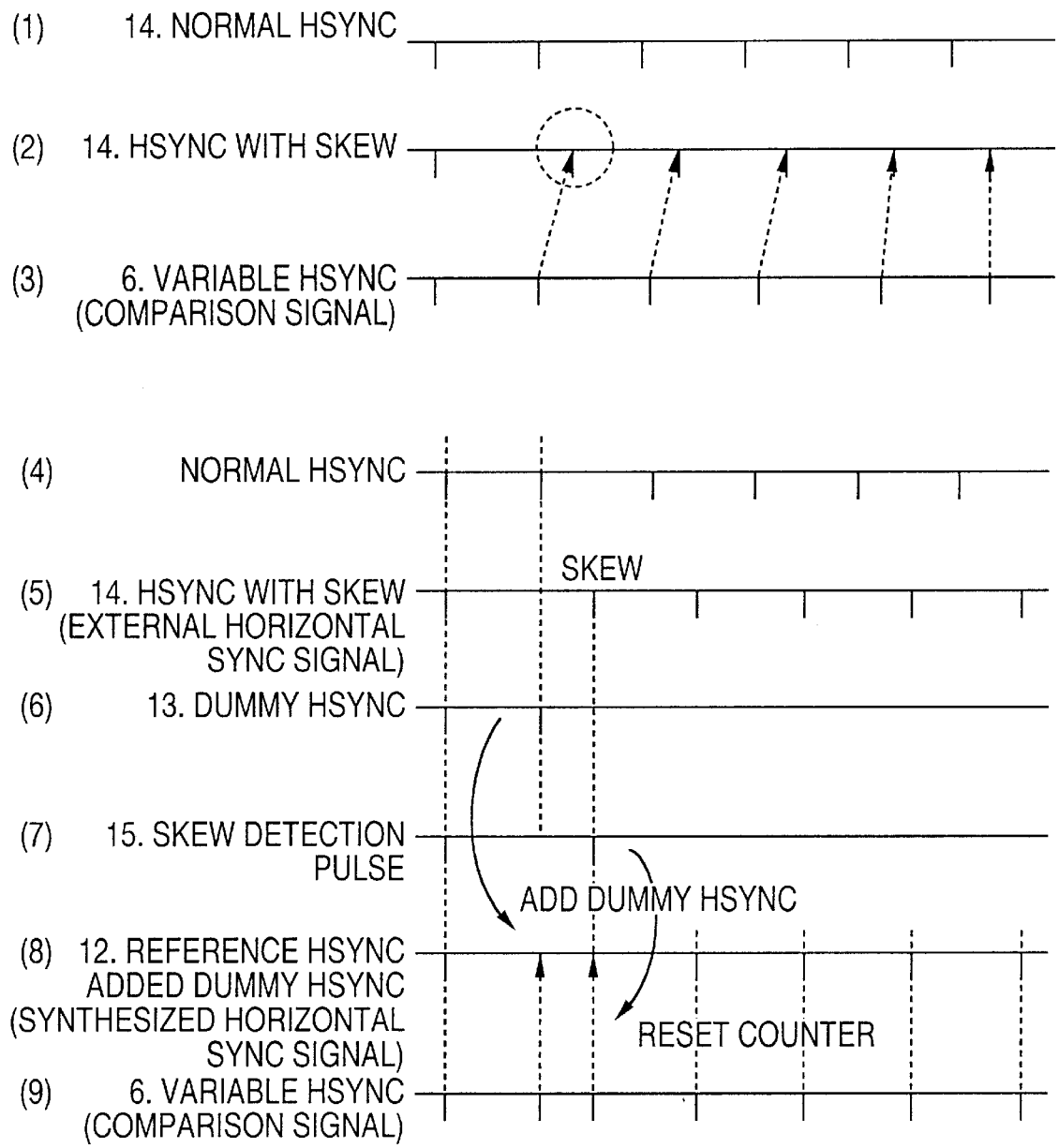
FIG. 8 is a timing chart illustrating a case where a skew occurs in a longer period than the expected period of the external horizontal sync signal 14.

FIG. 8 is a timing chart illustrating a case where a skew occurs in a longer period than the expected period of the external horizontal sync signal 14. As in FIG. 7, (1), (2) and (3) illustrate the operation of the conventional ordinary PLL circuit, and (4) to (9) illustrate the operation of the PLL circuit in FIG. 6. As indicated by (1), the normal horizontal sync signal Hsync is a pulse signal which is repeated in a nearly constant period. When a skew (deviation) occurs in a long period as indicated by (2), however, a large phase difference is produced between the horizontal sync signal and the variable horizontal sync signal (comparison signal) 6 which is fed back. This causes lock-off, and the VCO 4 performs control in accordance with the phase difference in such a way as to decrease the frequency of the system clock signal. Lock-in is implemented in this manner, but when a phase difference becomes significantly large, lock-in will take a long time.

In a case of the PLL circuit 35 shown in FIG. 6, therefore, first, the skew detection/dummy pulse generation circuit 11 generates the dummy horizontal sync signal pulse 13 as shown in (6) and synthesizes it with the external horizontal sync signal 14 as shown in (8), when the external horizontal sync signal 14 is not input at the expected timing. Therefore, a phase difference will not be produced between the synthesized horizontal sync signal 12 and the variable horizontal sync signal 6 which has been synchronized with the external horizontal sync signal 14 until then. Or only a slight phase difference within the control range of the VCO 4 is produced.

When a skew pulse in a long period occurs later as shown in (5), the skew pulse is detected and the skew detection pulse 15 is output from the skew detection/dummy pulse generation circuit 11, thereby resetting the counter 5 and the phase comparator 2.

Consequently, as indicated in (8) in FIG. 8, the synthesized horizontal sync signal 12 for reference, which is the external horizontal sync signal 14 ((5)) synthesized with the dummy pulse 13 ((6)), and the variable horizontal sync signal 6 or the comparison signal which is generated in the PLL operation have the same pulse before and after the occurrence of the skew, so that the phase comparator 2 does not detect a large phase difference. Thereafter, the external horizontal sync signal 14 of a given period is supplied and the variable horizontal sync signal 6 synchronous with that signal is generated as has been done previously. The PLL circuit can therefore return to the original lock-in state quickly after occurrence of a skew.

The above-described operation can prevent a large lock-off and can keep the lock-in state when pulse fall-out occurs in the horizontal sync signal due to drop-out or the like, or an extra pulse is added, as well as when a skew occurs in the supplied horizontal sync signal 14.

In accordance with occurrence of a skew, the phase comparator 2 is reset too in addition to the scheme of compensating the external horizontal sync signal 14 and resetting the loop counter 5 in the PLL circuit. The reason is as follows. At some timing, the dummy pulse 13 may overlap the external horizontal sync signal 14. Then, a phenomenon like pulse drop-out from the synthesized horizontal sync signal 12 happens, and the phase comparator 2 detects a phase difference of close to 360 degrees, so that the system clock signal 45 and the variable horizontal sync signal 6 are both deviated considerably. When a skew occurs, therefore, the loop counter 5 and the phase comparator 2 are both reset to set the phase difference to zero, thereby preventing such a phenomenon.

Figure 9:
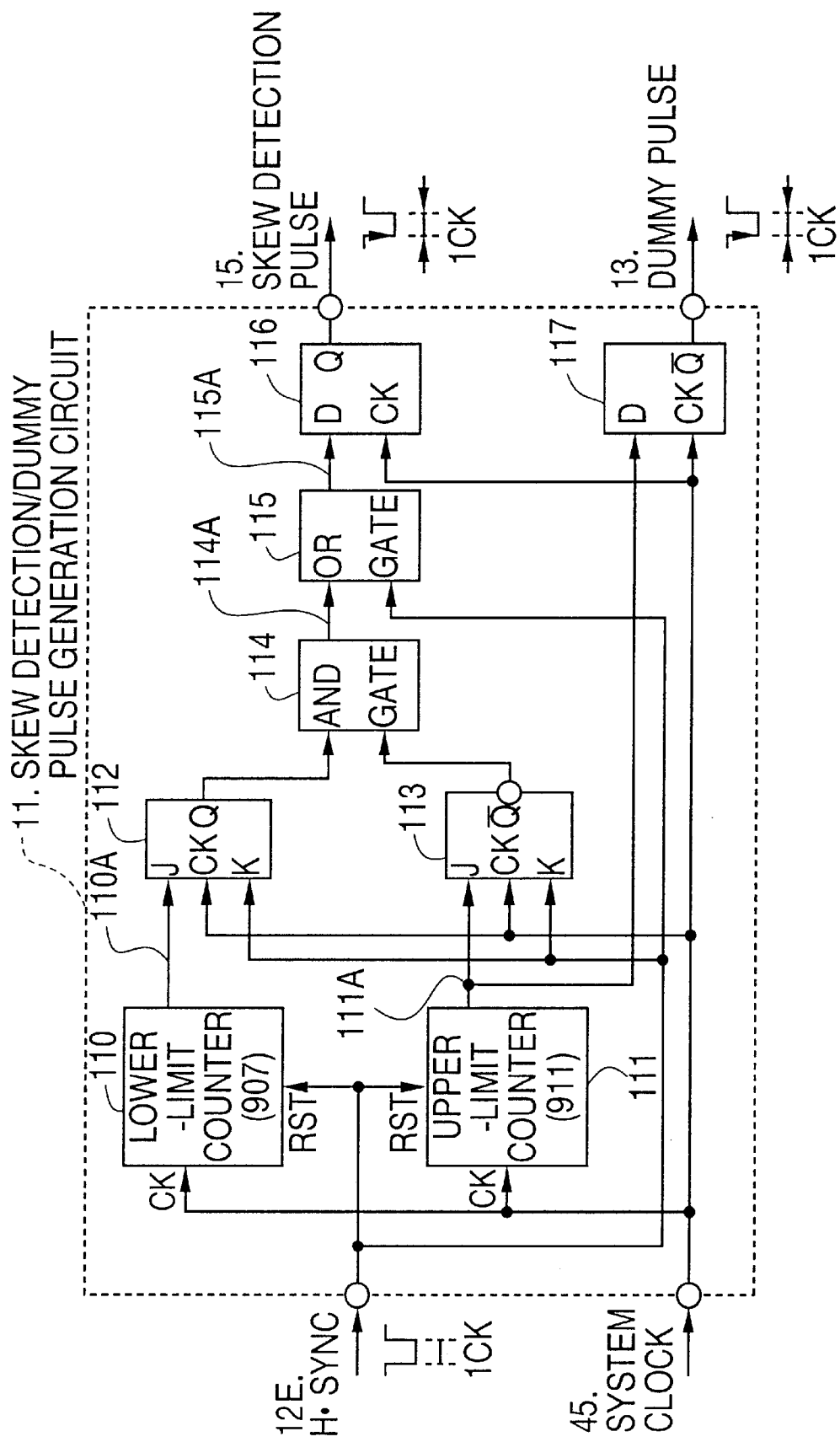
FIG. 9 is a detailed internal circuit diagram of a skew detection/dummy pulse generation circuit 11.
Figure 10:
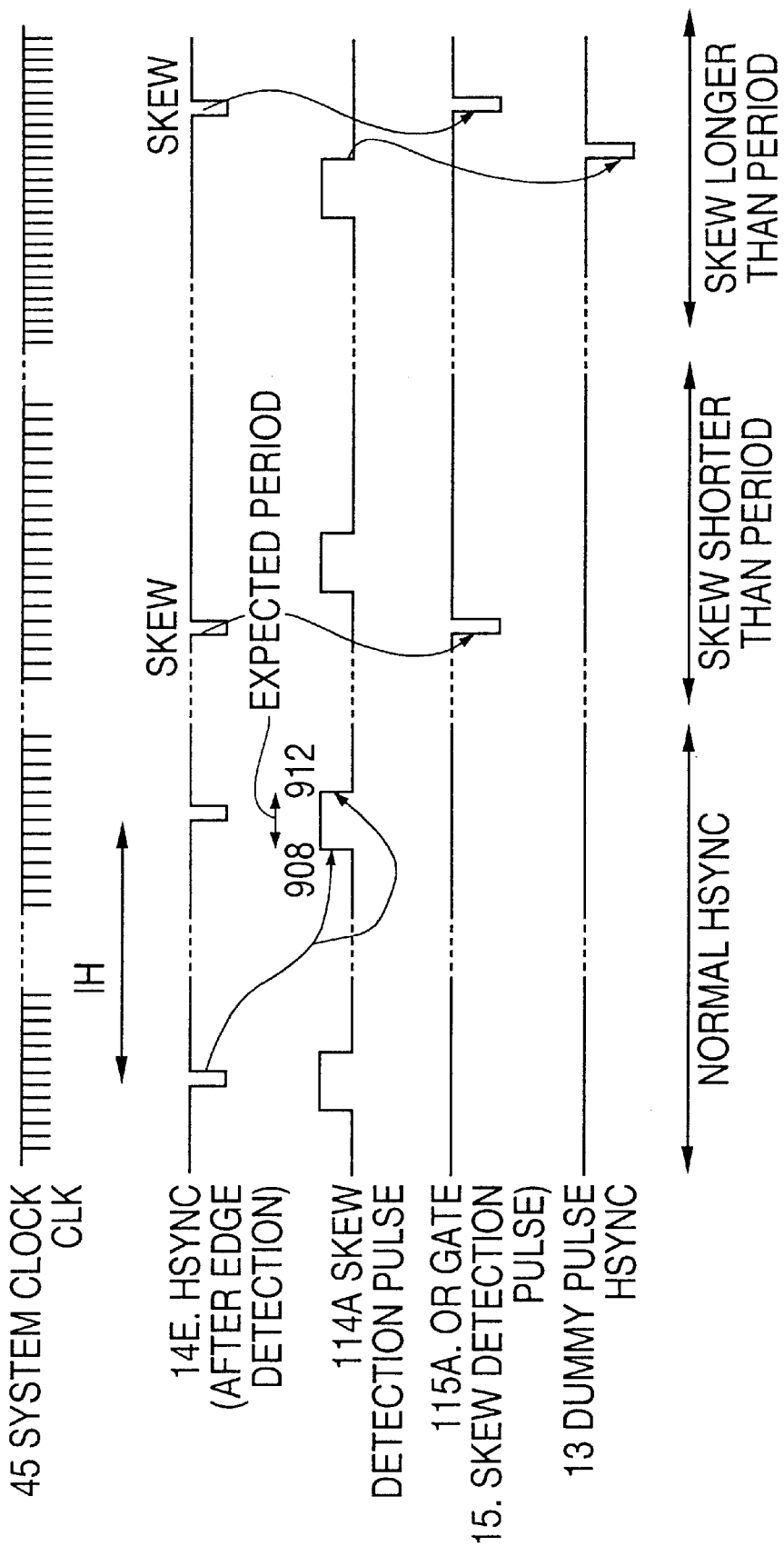
FIG. 10 is a timing chart for explaining the operation of the circuit in FIG. 9.

FIG. 9 presents a detailed internal circuit diagram of the skew detection/dummy pulse generation circuit 11 in FIG. 6. FIG. 10 is a timing chart for explaining the operation of the circuit.

As shown in FIG. 9, the skew detection/dummy pulse generation circuit is supplied with the output 14E of the edge detector 10 (see FIG. 6) which detects the falling edge of the external horizontal sync signal 14 and generates a pulse having a width of one clock.

The principle of skew detection is such that with the falling edge of the horizontal sync signal 14E taken as a reference, a skew detection pulse 114A corresponding to an expected period in which the next horizontal sync signal 14E will be generated is formed by a lower-limit counter 110, an upper-limit counter 111, JK flip-flops 112 and 113 and an AND gate 114. If the horizontal sync signal 14E is generated within that expected period, the state is determined as normal and the skew detection pulse 15 is not generated. When the horizontal sync signal 14E is not generated in the expected period, the skew detection pulse 15 is generated. That is, skew detection is implemented by monitoring disturbance of the period of the external horizontal sync signal 14.

Specifically, assuming that one period of the horizontal sync signal 14E is equivalent to 910 clocks of the system clock signal 45, the output 110A of the lower-limit counter 110 is set to an H level when the lower-limit counter 110 counts 908 clocks from the falling edge of the horizontal sync signal 14E, and the output 111A of the upper-limit counter 111 is set to an H level when the upper-limit counter ill counts 912 clocks. Then, a positive output Q of the JK flip-flop 112 and a negative output /Q of the JK flip-flop 113 are synthesized by the AND gate 114, generating the skew detection pulse 114A. When a skew pulse is generated at other times than the H-level duration (expected period) of the skew detection pulse 114A, the skew detection signal 15 (115A) is output.

The skew detection/dummy pulse generation circuit 11 is designed in such a way as to generate the dummy pulse 13 when the external horizontal sync signal 14E is generated in the expected period. Specifically, a flip-flop 117 outputs the dummy pulse 13 when the upper-limit counter 112 counts up to 911 clocks and outputs a carry without being reset. In FIG. 10, the dummy pulse 13 is generated when a skew pulse longer than the period is generated. When the horizontal sync signal 14E is generated normally or in a short period before the end of the expected period, the upper-limit counter 112 is reset and the dummy pulse 13 will not be generated.

This circuit structure can generate the dummy pulse 13 even when pulse drop-out occurs in the horizontal sync signal 14E. This dummy pulse 13 is synthesized with the external horizontal sync signal 14 in the synthesizing circuit 17 and is supplied to the phase comparator as the synthesized horizontal sync signal (reference signal) 12.

Figure 11:
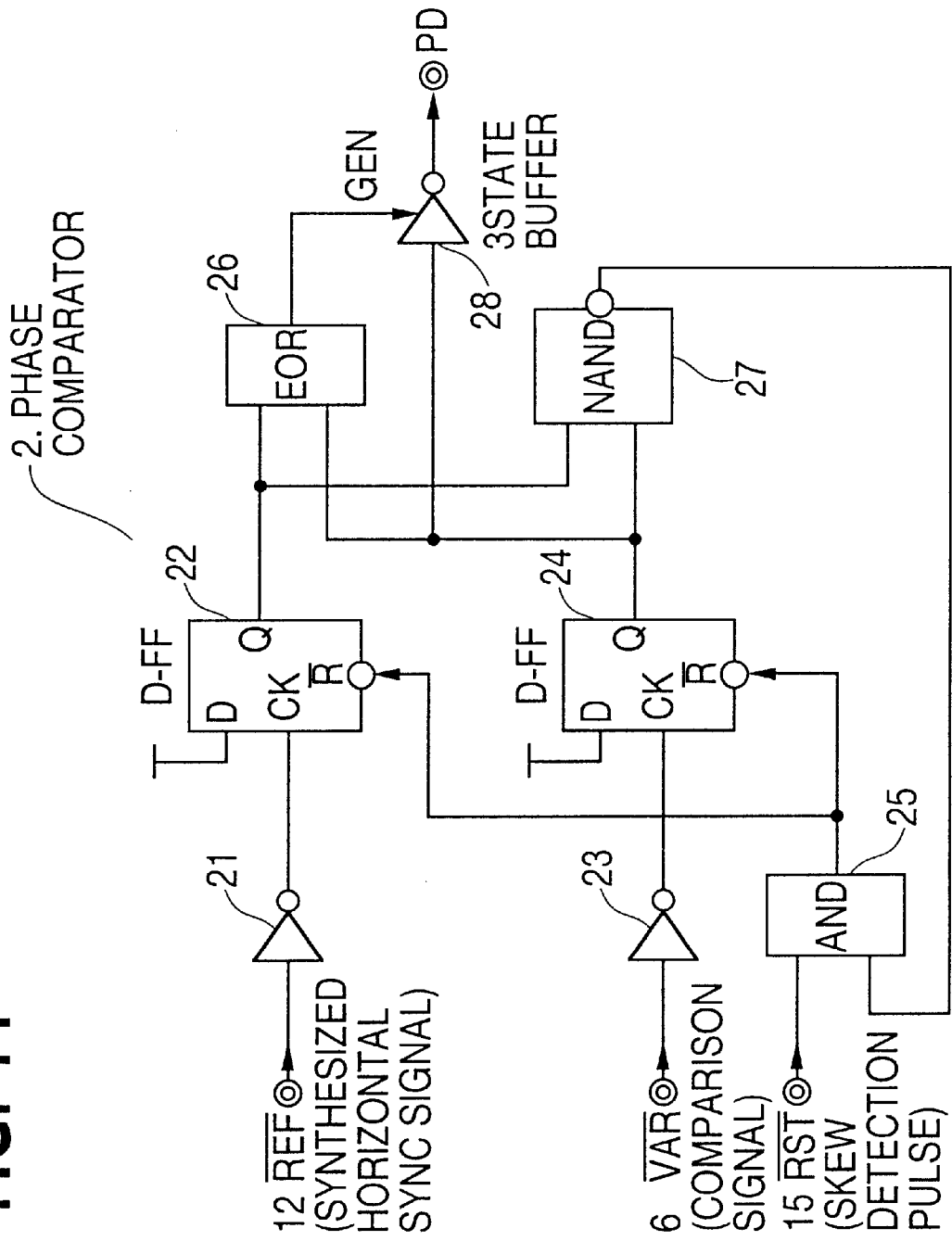
FIG. 11 is a detailed circuit diagram of a phase comparator 2.
Figure 12:
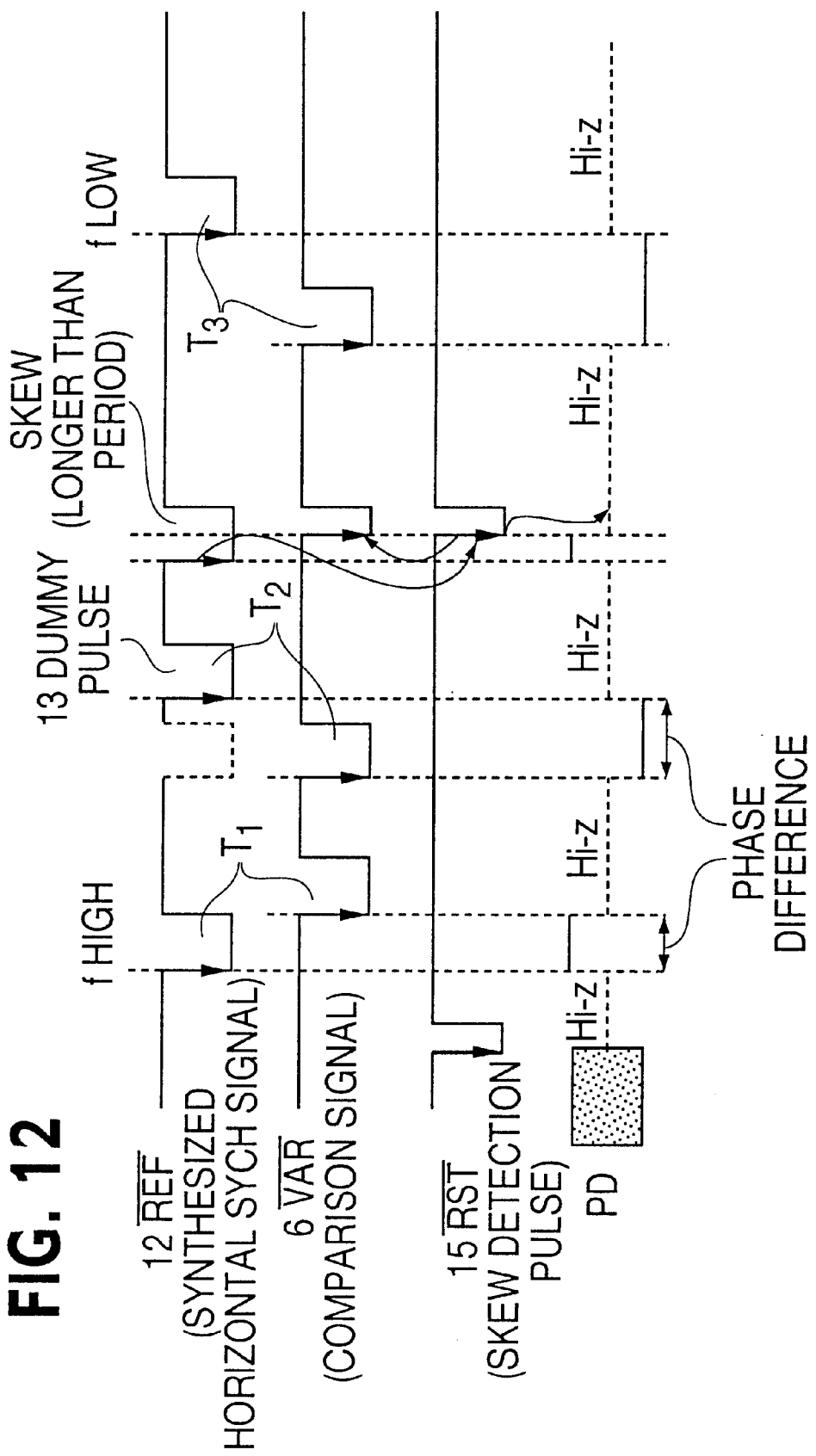
FIG. 12 is a timing chart for explaining the operation of the phase comparator in FIG. 11.

FIG. 11 presents a detailed circuit diagram of the phase comparator 2, and FIG. 12 is a timing chart for explaining its operation. The fundamental operation of this phase comparator 2 is such that in a period where there is a phase difference between the synthesized horizontal sync signal 12 and the variable horizontal sync signal 6, an EOR gate 26 sets the output to an H level, enabling a 3-state buffer 28 at the final stage, and a phase difference detection signal PD of that output is set to an H or L level depending on which sync signal is leading or lagged. Note that each of flip-flops 22 and 24 outputs, on its output Q, an H level which is given to its input D when an H level is input to the clock CK input.

For example, at time T1, the synthesized horizontal sync signal 12 is leading or is changed toward a higher frequency as shown in FIG. 12. In this case, the output Q of the flip-flop 22 becomes an H level but the output of the flip-flop 24 is kept at the L level, so that the output of the EOR gate 26 becomes an H level, thus enabling the 3-state buffer 28. In a period in which there is a phase difference, therefore, the output of the 3-state buffer 28 becomes an H level according to the L-level output of the flip-flop 24.

This H-level output is converted to a voltage value according to the length of that period in the integrator 3 at the subsequent stage, and is then supplied to the VCO 4 at the subsequent stage.

At time T3 in FIG. 12, the opposite case to the case of T1, the synthesized horizontal sync signal 12 is lagged and the phase difference detection signal PD becomes an L level. Once both sync signals are input, the output of the EOR gate 26 becomes an L level so that the output of the 3-state buffer goes to an H impedance state.

Time T2 shows an example of a case where a skew is generated in a direction longer than the period as has been explained with reference to FIG. 8. That is, at time T2, the external horizontal sync signal 14 (broken line in the diagram) is not generated as expected, so that the dummy pulse 13 is added to the synthesized horizontal sync signal 12 or the output of the synthesizing circuit 17. As a result, only a slight phase difference is produced between pulses of the comparison signal 6 and the synthesized horizontal sync signal 12 and the PLL circuit maintains the stable state as usual. When a skew-originated pulse is produced in the synthesized horizontal sync signal 12, the skew detection pulse 15 is input accordingly, so that both flip-flops 22 and 24 are reset. The output of the 3-state buffer 28 is thus reset to an H impedance state, and the normal operation at the subsequent time T3 is maintained. In accordance with occurrence of a skew, the skew detection pulse 15 is generated and the counter 5 is reset, so that a pulse in phase with that pulse but having an L level is generated in the comparison signal 6.

According to the second embodiment, as described above, even when occurrence of a skew or pulse drop-out in the horizontal sync signal which frequently happens in a home VTR or the like, by adding a dummy pulse as needed and resetting the counter and phase comparator in the PLL circuit, a lock-in state can be held with respect to the horizontal sync signal that will be properly generated thereafter. As a result, it can be held within the lock range as much as possible, and the PLL operation can keep the lock-in state in a pseudo fashion, thus ensuring generation of a stable system clock signal. It is thus possible to avoid a phenomenon such that a large phase deviation occurs and a lock-off state is kept long during which images are disturbed.

Figure 13:
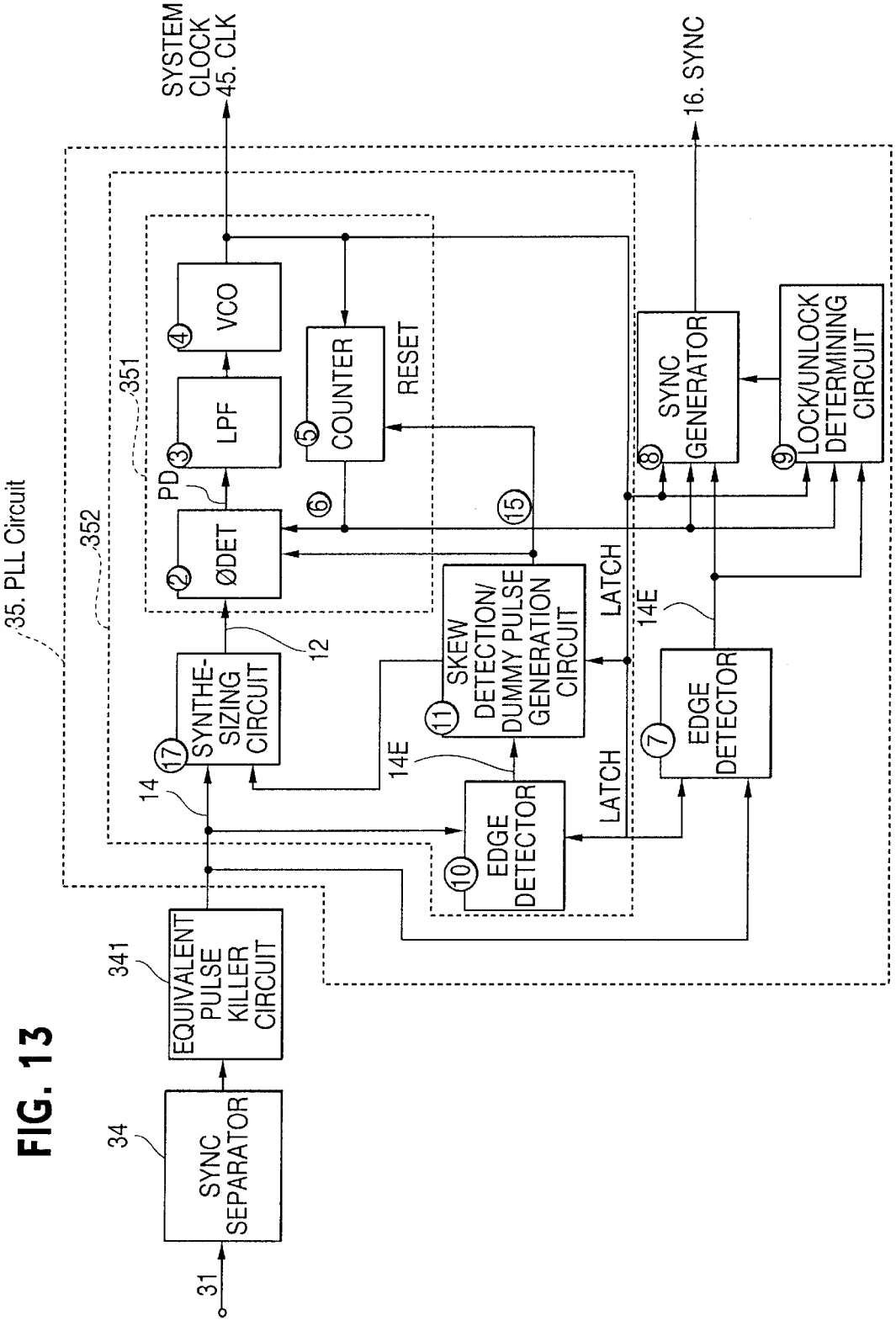
FIG. 13 is a block diagram of the internal structure of a synthesizing circuit in a PLL circuit which implements both first and second embodiments.

A third embodiment of this invention provides a synthesizing circuit which has both the function of the PLL circuit of the first embodiment and the function of the PLL circuit of the second embodiment. FIG. 13 is a block diagram of the internal structure of such a synthesizing circuit. Referring to FIG. 13, "351" denotes an ordinary PLL circuit portion, "352" denotes the PLL circuit according to the second embodiment and "35" denotes a PLL circuit to which the function of the PLL circuit of the first embodiment is added.

In the synthesizing circuit according to the third embodiment, the PLL circuit of the first embodiment serves to detect a phase difference between the external horizontal sync signal 14 and the comparison signal 6, and when there is a phase difference, it determines the state as an unlocked state and switches the internal sync signal 16 to the external sync signal 14. The internal sync signal 16 during the unlock-in period is kept to the external sync signal 14.

Further, the PLL circuit of the second embodiment serves to monitor the period of the external horizontal sync signal 14, and performs compensation in such a way that the PLL circuit itself does not go into an extreme unlocked state, when the period is disturbed. Thus, the system clock signal 45 is stabilized. At this time, even when there is a phase difference between the external horizontal sync signal 14 and the comparison signal 6, the compensating operation by the PLL circuit according to this embodiment is not implemented.

The edge detectors 7 and 10 have the same function and can be shared.

INDUSTRIAL APPLICABILITY

As described above, the PLL circuit of this invention is suitable for use in digital display apparatuses such as a PDP (Plasma Display Panel) display device and LCD (Liquid Crystal Display) device. The PLL circuit of this invention can prevent disturbance of images to be displayed on such a digital display apparatus.

What is claimed is:

1. A phase locked loop circuit for a digital display apparatus for outputting a clock signal whose frequency is a multiple of a frequency of a horizontal sync signal to be supplied by an integer number, and feeding back a comparison signal whose frequency is said clock signal frequency-divided by said integer number to thereby generate said clock signal phase-synchronous with said horizontal sync signal, said phase locked loop circuit comprising:

a lock/unlock detection circuit for comparing phases of said horizontal sync signal and said comparison signal to detect a locked state and an unlocked state of said phase locked loop circuit; and an internal sync signal generation circuit for outputting said comparison signal inside as an internal sync signal when said locked state is detected by said lock/unlock detection circuit and outputting said horizontal sync signal as said internal sync signal when said unlocked state is detected.

2. The phase locked loop circuit according to claim 1, wherein said lock/unlock detection circuit detects a locked state or an unlocked state by determining whether or not said horizontal sync signal is supplied in a predetermined comparison period based on said comparison signal.

3. A digital display apparatus for receiving from outside an external horizontal sync signal, an external vertical sync signal and an analog image signal having a predetermined timing based on said external sync signals, generating a digital image signal inside and displaying an image, said apparatus comprising:

a phase locked loop circuit for outputting a clock signal whose frequency is a multiple of a frequency of said horizontal sync signal by an integer number, and feeding back a comparison signal whose frequency is said clock signal frequency-divided by said integer number to thereby generate said clock signal phase-synchronous with said horizontal sync signal;

a generation circuit for generating an internal horizontal sync signal based on said comparison signal when said phase locked loop circuit is in a locked state, and generating the internal horizontal sync signal based on said external horizontal sync signal when said phase locked loop circuit is in an unlocked state;

an analog-to-digital converter for sampling said analog image signal in accordance with said clock signal, thereby generating the digital image signal; and a display unit for displaying the image in accordance with said digital image signal and said internal horizontal sync signal.

4. The digital display apparatus according to claim 3, further comprising a lock/unlock detection circuit for comparing said horizontal sync signal and said comparison signal to detect the locked state and the unlocked state of said phase locked loop circuit.

5. The digital display apparatus according to claim 4, wherein said lock/unlock detection circuit detects the locked state or the unlocked state by determining whether or not said horizontal synch signal is supplied in a predetermined comparison period based on said comparison signal.

6. The digital display apparatus according to claim 3, wherein said display unit is comprised of a plasma display panel or a liquid crystal display panel.

7. A phase locked loop circuit for a display apparatus for generating a clock signal synchronous with an external sync signal in an image signal to be supplied, comprising:

a phase comparator for comparing phases of a reference signal including said external sync signal and a comparison signal and generating an output according to the phase difference therebetween;

an oscillator for controlling a frequency of said clock signal of output in accordance with said phase difference;

a frequency divider for frequency-dividing said clock signal by an integer number to thereby generate said comparison signal;

a skew detector for detecting occurrence of a skew, in which the phase in said external sync signal is deviated from a normal period, to reset said frequency divider and generating a dummy pulse upon detection of said external sync signal being not generated even when said normal period has elapsed; and a synthesizing circuit for synthesizing said external sync signal and said dummy pulse to thereby generate said reference signal.

8. The phase locked loop circuit according to claim 7, wherein said skew detector resets said phase comparator when detecting that said skew has occurred.

9. The phase locked loop circuit according to claim 7, wherein said skew detector determines if said external sync signal is generated in a period around a time at which said normal period has passed from said external sync signal, and detects the occurrence of the skew when detecting said external sync signal in a period outside said period around said time at which said normal period has passed.

10. The phase locked loop circuit according to claim 7, wherein said skew detector determines if said external sync signal is generated in a period around a time at which said normal period has passed from said external sync signal, and generates said dummy pulse when said external sync signal is not detected before an end of said period around said time at which said normal period has passed.

11. A digital display apparatus for receiving from outside an external horizontal sync signal, an external vertical sync signal and an analog image signal having a predetermined timing based on said external sync signals, generating a digital image signal inside and displaying an image, said apparatus comprising:

a phase comparator for comparing phases of a reference signal including said external horizontal sync signal and a comparison signal and generating an output according to the phase difference therebetween;

an oscillator for controlling a frequency of said clock signal of output in accordance with said phase difference;

a frequency divider for frequency-dividing said clock signal by an integer number to thereby generate said comparison signal;

a skew detector for detecting occurrence of a skew, in which the phase in said external sync signal is deviated from a normal period, to reset said frequency divider and generating a dummy pulse upon detection of said external sync signal being not generated even when said normal period has elapsed;

a synthesizing circuit for synthesizing said external sync signal and said dummy pulse to thereby generate said reference signal;

an analog-to-digital converter for sampling said analog image signal in accordance with said clock signal, thereby generating the digital image signal; and a display unit for displaying the image in accordance with said digital image signal.

12. A digital display apparatus for receiving from outside an external horizontal sync signal, an external vertical sync signal and an analog image signal having a predetermined timing based on said external sync signals, generating a digital image signal inside and displaying an image, said apparatus comprising:

a phase comparator for comparing phases of a reference signal including said external horizontal sync signal and a comparison signal and generating an output according to the phase difference therebetween;

an oscillator for controlling a frequency of said clock signal of output in accordance with said phase difference;

a frequency divider for frequency-dividing said clock signal by an integer number to thereby generate said comparison signal;

a skew detector for detecting occurrence of a skew, in which the phase in said external sync signal is deviated from a normal period to reset said frequency divider and said phase comparator;

an analog-to-digital converter for sampling said analog image signal in accordance with said clock signal, thereby generating the digital image signal; and a display unit for displaying the image in accordance with said digital image signal.

13. The digital display apparatus according to claim 11, wherein said skew detector resets said phase comparator when detecting that said skew has occurred.

14. A phase locked loop circuit for a display apparatus for generating a clock signal synchronous with an external sync signal in an image signal to be supplied comprising:

a phase comparator for comparing phases of a reference signal including said external sync signal and a comparison signal and generating an output according to the phase difference therebetween;

an oscillator for controlling a frequency of said clock signal of output in accordance with said phase difference;

a frequency divider for frequency-dividing said clock signal by an integer number to thereby generate said comparison signal; and a skew detector for detecting occurrence of a skew, in which the phase in said external sync signal is deviated from a normal period, to reset said frequency divider and said phase comparator.

15. A phase locked loop circuit for a digital display apparatus for outputting a clock signal whose frequency is a multiple of a frequency of a horizontal sync signal to be supplied by an integer number, and feeding back a comparison signal whose frequency is said clock signal frequency-divided by said integer number to thereby generate said clock signal phase-synchronous with said horizontal sync signal, said phase locked loop circuit comprising:

a phase comparator for comparing phases of a reference signal including said external sync signal and a comparison signal and generating an output according to the phase difference therebetween;

an oscillator for controlling a frequency of said clock signal of output in accordance with said phase difference;

a frequency divider for frequency-dividing said clock signal by an integer number to thereby generate said comparison signal;

a skew detector for detecting occurrence of a skew, in which the phase in said external sync signal is deviated from a normal period, to reset said frequency divider;

a lock/unlock detection circuit for comparing phases of said horizontal sync signal and said comparison signal to detect a locked state and an unlocked state of said phase locked loop circuit; and an internal sync signal generation circuit for outputting said comparison signal inside as an internal sync signal when said locked state is detected by said lock/unlock detection circuit and outputting said horizontal sync signal as said internal sync signal when said unlocked state is detected.

16. The phase locked loop circuit according to claim 15, wherein said skew detector generates a dummy pulse upon detection of said sync signal being not generated even when said normal period has elapsed; and further comprising a synthesizing circuit for synthesizing said external sync signal and said dummy pulse to thereby generate said reference signal.

17. The phase locked loop circuit according to claim 15, wherein said skew detector resets said phase comparator when detecting that said skew has occurred.

\* \* \* \* \*

UNITED STATES PATENT AND TRADEMARK OFFICE
CERTIFICATE OF CORRECTION

PATENT NO. : 6,392,641 B1  
DATED : May 21, 2002  
INVENTOR(S) : Eizo Nishimura et al.

It is certified that error appears in the above-identified patent and that said Letters Patent is hereby corrected as shown below:

<u>Title page,</u>  
Item [73], Assignee, delete "Fujitsu Limited", insert -- Fujitsu General Limited --  
Item [56], References Cited, delete "Kutski", insert -- Kutsuki --

<u>Column 13,</u>  
Line 58, insert -- , -- after "divider"

<u>Column 14,</u>  
Line 32, insert -- , -- after "divider"  
Line 63, insert -- , -- after "period"

<u>Column 15,</u>  
Line 8, insert -- , -- after "supplied"

Signed and Sealed this

Twenty-sixth Day of November, 2002

*Attest:*

JAMES E. ROGAN  
*Attesting Officer*   *Director of the United States Patent and Trademark Office*